United States Patent

Wessels et al.

[11] Patent Number: 5,753,300
[45] Date of Patent: May 19, 1998

[54] ORIENTED NIOBATE FERROELECTRIC THIN FILMS FOR ELECTRICAL AND OPTICAL DEVICES AND METHOD OF MAKING SUCH FILMS

[75] Inventors: Bruce W. Wessels, Wilmette, Ill.; Michael J. Nystrom, Germantown, Md.

[73] Assignee: Northwestern University, Evanston, Ill.

[21] Appl. No.: 491,672

[22] Filed: Jun. 19, 1995

[51] Int. Cl.$^6$ .................................................. C23C 16/00
[52] U.S. Cl. ................................ 427/126.3; 427/255.1; 427/255.2; 427/255.3
[58] Field of Search .................... 427/126.3, 255.1, 427/255.2, 255.3

[56] References Cited

U.S. PATENT DOCUMENTS

| | | | |
|---|---|---|---|
| 5,204,314 | 4/1993 | Kirlin et al. | 427/255.2 |
| 5,250,817 | 10/1993 | Fink. | |
| 5,536,323 | 7/1996 | Kirlin et al. | 118/726 |

OTHER PUBLICATIONS

Growth Studies of Ferroelectric Oxide Layers Prepared by Organometallic Chemical Vapor Deposition; J. Crystal Grow. 107(1991) pp. 712–715. L.A. Willis, et al.

Epitaxial Growth of Ferroelectric T.B. $Sr_{1-x}Ba_xNb_2O_6$ Films for Optoelectronic Applications; Mat. Res. Bull., vol. 22, pp. 1095–1102, R. R. Neurgaonkar, et al.

Ferroelectric Properties of Thin Strontium Barium Niobate Films, Ferroelectrics, 1985, vol. 63, pp. 235–242, V.D. Antsigin et al.

Sol–Gel Processing of Strontium–Barium Niobate Ferroelectric Thin Film; J. Mater. Res., vol. 5, No. 5, May, 1990, pp. 916–918, Ren Xu, et al.

Preparation of Strontium Barium Niobate by Sol–Gel Method; J. Am. Ceram. Soc., 75(6) (1992) pp. 1697–1700, Shin–ichi Horano, et al.

Development and Modification of Photorefractive Properties in the Tungsten Bronze Family Crystals; Opt. Eng. May 1987, vol. 26, No. 5, pp. 393–404, Ratnakar R. Neurgaonkar, et al.

Nonlinear Optical Properties of Textured Strontium Barium Niobate Thin Films Prepared by Metalorganic Chemical Vapor Deposition; Appl. Phys. Lett. 66(14), Apr. 3, 1995, pp. 1726–1728.

Electro–Optic Materials by Solid Source MOCVD; Mater. Res. Soc. Symp. Proc. 335, 229 (1993) 12 pages.

Growth of (001)–Oriented SBN Thin Films by Solid Source MOCVD; Mat. Res. Soc. Symp. Proc., vol. 335 (1994) pp. 59–65.

Chemical Vapor Deposition of Strontium–Barrium–Niobatel Mater. Res. Soc. Sym. Proc. 243, 457 (1993) 6 pages.

*Primary Examiner*—Archene Turner
*Attorney, Agent, or Firm*—Edward J. Timmer

[57] ABSTRACT

$Sr_xBa_{1-x}Nb_2O_6$, where x is greater than 0.25 and less than 0.75, and $KNbO_3$ ferroelectric thin films metalorganic chemical vapor deposited on amorphous or crystalline substrate surfaces to provide a crystal axis of the film exhibiting a high dielectric susceptibility, electro-optic coefficient, and/or nonlinear optic coefficient oriented preferentially in a direction relative to a crystalline or amorphous substrate surface. Such films can be used in electronic, electro-optic, and frequency doubling components.

14 Claims, 7 Drawing Sheets

ORIENTED NIOBATE FERROELECTRIC THIN FILMS FOR ELECTRICAL AND OPTICAL DEVICES AND METHOD OF MAKING SUCH FILMS

CONTRACTURAL ORIGIN OF THE INVENTION

This invention was made with Government support under grant Number: DMR-9120521 awarded by the National Science Foundation and the Department of Energy grant Number: DEFG 02 85 ER 45209. The Government may have certain rights in the invention.

FIELD OF THE INVENTION

The present invention relates to highly textured or epitaxial niobate ferroelectric thin films and a method of depositing such films on a variety of substrates for use in electrical and optical devices.

BACKGROUND OF THE INVENTION

Conventional dielectric thin film material used in the semiconductor industry comprises silicon dioxide ($Sio_2$). However, future electronic memory technology will demand thin film materials exhibiting a greater dielectric constant than that of silicon dioxide. That is, thin films having greater dielectric constant values will permit smaller individual storage device sizes and increased memory densities on integrated memory devices.

Polycrystalline ferroelectric materials are being considered for high dielectric constant thin film materials. However, ferroelectric thin film materials tend to have exceptional properties along one crystallographic direction or axis and only moderate properties along the other crystal directions or axes. Since polycrystalline ferroelectric thin films considered to-date are comprised of randomly oriented grains, the measured dielectric constant of these films will be an average of the dielectric constants in all directions. Thus, the average dielectric constant of polycrystalline ferroelectric thin films will be considerably less than the dielectric constant exhibited along the optimum crystal direction or axis of the crystal lattice.

Strontium barium niobate ($Sr_xBa_{1-x}Nb_2O_6$) where x is greater than 0.25 and less than 0.75 (hereafter SBN) is a ferroelectric material exhibiting excellent dielectric and electro-optic properties which are highest along the c-axis of the tetragonal tungsten bronze crystal lattice as described by Prokhorov et al. in Ferroelectric Crystals for Laser Radiation Control, (Adam Hilger, New York, 1990) p. 81. Initial studies of $Sr_xBa_{1-x}Nb_2O_6$ were carried out on Czochralski-grown single crystals as described by Neurgaonkar et al. in Ferroelectrics 15, 31 (1984). In addition, liquid-phase epitaxy, rf sputtering, and sol-gel growth of textured $Sr_xBa_{1-x}Nb_2O_6$ thin films have been reported. For example, liquid-phase epitaxy was used by Neurgaonkar et al. in Mater. Res. Bull. 22, 1095 (1987). Rf sputtering was used by Antisigin et al. in Ferroelectrics 63, 235 (1985), while sol-gel was employed by Xu et al. in J. Mater. Res. 5, 916 (1990) and by Hirano et al. in J. Am. Ceram. Soc. 75, 1697 (1992). Recently, growth of these films by conventional and single source metalorganic chemical vapor deposition (MOCVD) was reported by Greewald et al. in Mater. Res. Soc. Symp. Proc. 243, 457 (1993) and by Lu et al. in Mater. Res. Soc. Symp. Proc. 335, 59 (1994).

Potassium niobate ($KNbO_3$) is promising ferroelectric material for electro-optic (EO), nonlinear optic (NLO) and photorefractive applications. The electro-optic figure of merit is 13 picometers/volt which surpasses that of $LiNbO_3$. In addition, potassium niobate possesses excellent non-linear optical coefficients ($d_{31}$=15 picometer/volt and $d_{33}$=27 picometer/volts). The growth of $KNbO_3$ films also has been demonstrated by liquid phase epitaxy, sol-gel, ion beam sputtering, RF sputtering and pulsed laser deposition techniques and recently by single source metal-organic chemical vapor deposition that produced polycrystalline films with a preferred orientation. However, for practical NLO and EO applications, highly textured or epitaxial thin films are required.

An object of the present invention is to provide a highly textured or epitaxial niobate ferroelectric thin film deposited on an amorphous or crystalline substrate surface with a crystal axis exhibiting a desireable property preferentially oriented or aligned relative to the substrate surface.

Another object of the present invention is to provide a MOCVD method of depositing a highly textured or oriented strontium barium or other niobate ferroelectric thin film on an amorphous as well as crystalline substrate surface with a crystal axis exhibiting a desireable property preferentially oriented or aligned to the substrate surface.

Still another object of the present invention to provide a MOCVD method of depositing a highly textured or epitaxial potassium niobate ferroelectric thin film on a substrate surface using improved precursors with a crystal axis exhibiting a desireable property preferentially oriented or aligned to the substrate surface.

SUMMARY OF THE INVENTION

One embodiment of the present invention provides a method of depositing a highly textured or epitaxial niobate ferroelectric thin film on a substrate surface, which may be amorphous or crystalline, in a reactor by metalorganic chemical vapor deposition under conditions that the ferroelectric thin film is deposited with a crystal axis thereof exhibiting a desireable property, such as dielectric constant and/or electro-optic coefficient, preferentially oriented or aligned to the substrate surface. For example only, particular strontium-bearing metalorganic reactant, a barium-bearing metalorganic reactant, niobium-bearing metalorganic reactant, and oxygen reactant can be provided in proper proportions in the reactor and reacted under temperature and low pressure conditions to deposit on an amorphous substrate surface a SBN ferroelectric thin film with a high degree of preferential orientation of the c-axis of the crystal lattice perpendicular or normal to the substrate surface.

For further example only, a particular potassium-bearing metalorganic reactant, niobium-bearing metalorganic reactant, and oxygen reactant can be provided in proper proportions in the reactor and reacted under temperature and low pressure conditions to deposit on a substrate surface a highly oriented ferroelectric potassium niobate thin film.

The present invention is advantageous in that the preferentially oriented ferroelectric thin film can be deposited on amorphous as well as crystalline substrate surfaces, such as amorphous silicon dioxide in widespread use in semiconductor devices. The preferentially aligned ferroelectric thin films of the invention thus can be readily integrated into silicon base microelectronics.

The present invention provides a highly textured or epitaxial niobate ferroelectric thin film deposited by metalorganic chemical vapor depostion on an amorphous or crystalline substrate surface to provide an axis of the crystal lattice exhibiting a high dielectric constant, electro-optic coefficient, or other property with a high degree of preferential orientation or alignment relative to the substrate surface. Thus, the high dielectric constant and/or electrooptic properties along the a particular axis of a thin ferroelectric film can substantially improve performance of electrical and electro-optic devices incorporating such films.

The above and other objects and advantages of the present invention will become more readily apparent from the following detailed description taken with the following drawings.

DESCRIPTION OF THE INVENTION

The following detailed description of the invention is offered for purposes of illustrating the present invention in greater detail and not limiting the scope of the invention.

A SBN ($Sr_xBa_{1-x}Nb_2O_6$) where x is greater than 0.25 and less than 0.75 ferroelectric thin film was deposited by metalorganic chemical vapor deposition (hereafter MOCVD) on flat, planar substrates including, but not limited to, single crystal (100) MgO and amorphous $SiO_2$ formed by oxidizing a single crystal (100) Si substrate. Particular reactants (i.e. metalorganic precursors) bearing the film components (e.g. strontium, barium, niobium, and oxygen) were provided in a reactor and reacted in proportions and under conditions of temperature and relatively low pressure controlled to deposit a SBN thin film having the c-axis of the hexagonal tungsten bronze crystal lattice oriented with a high degree of preferential alignment perpendicular to the substrate surface plane.

Metalorganic chemical vapor deposition apparatus described by L. A. Wills et al. in *J. Cryst. Growth*, 107, 712 (1991), the teachings of which are incorporated herein by reference, can be modified and used in the practice of the present invention to deposit the SBN thin film on a suitable substrate with a high degree of preferential alignment of the c-axis normal to the substrate surface plane.

Figure 1:
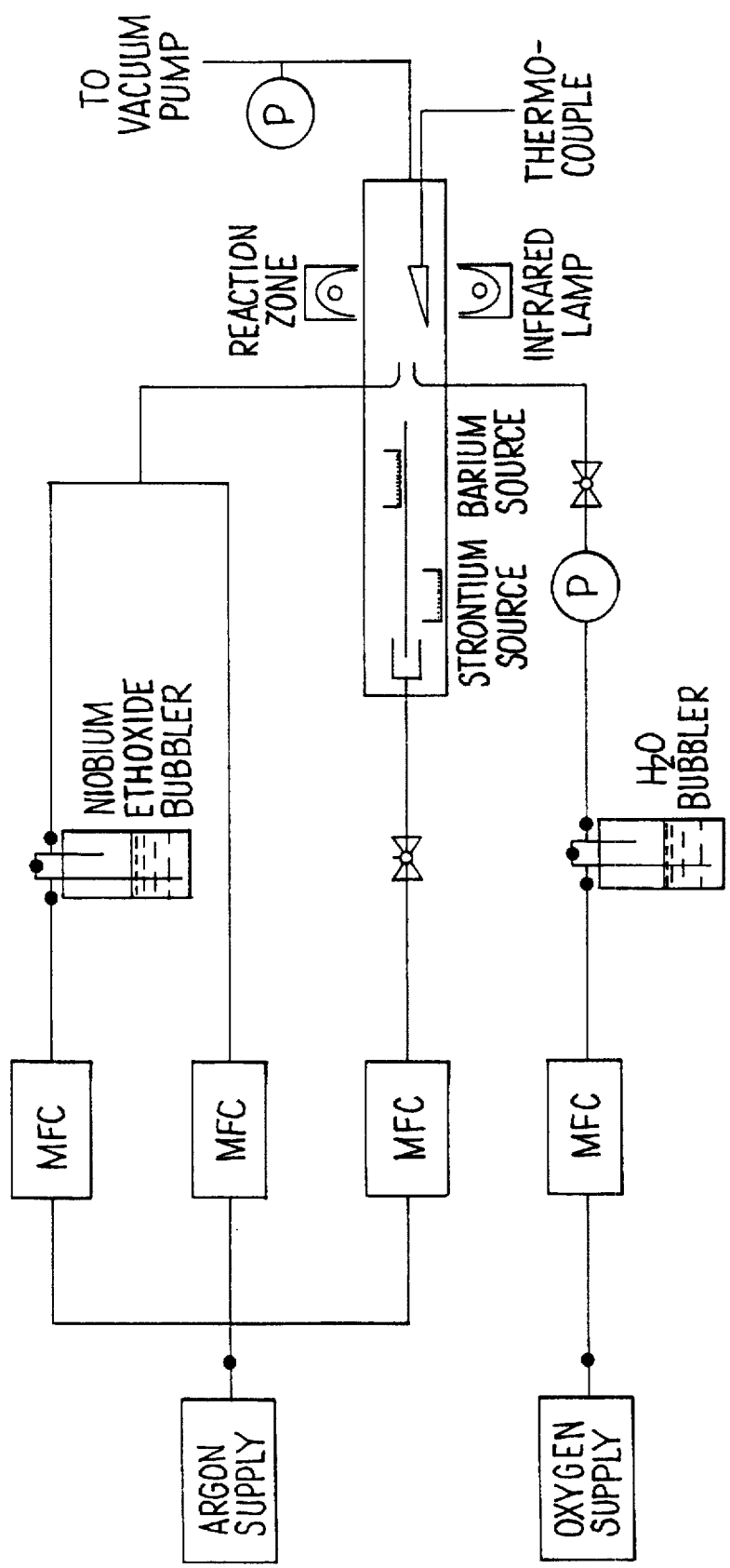
FIG. 1 is a schematic illustration of apparatus for metalorganic chemical vapor deposition of a preferentially oriented SBN ferroelectric thin film on a substrate.

Apparatus to this end is shown schematically in FIG. 1 and comprises a low pressure, two-zone horizontal quartz reactor system having a reactor zone that is provided with particular reactants (metalorganic precursors) in suitable proportions for reaction under the temperature and relatively low pressure conditions in the reaction zone to deposit or grow the SBN thin film on the substrate S.

In the practice of one embodiment of the invention to form an SBN thin film on a substrate, particular metalorganic precursors used included:

Sr (hexafluroacetylacetonate)$_2$ (tetraglyme)

Ba (hexafluoracetylacetonate)$_2$ (tetraglyme)

niobium pentaethoxide

The Sr and Ba (hexafluroacetylacetonate)$_2$ (tetraglyme) solid sources (prepared pursuant to G. Malandrino et al., Applied Physics Letters, vol. 58, page 182, 1991) were placed in separate reactor source zones in the manner shown in FIG. 1 and resistively heated. The liquid niobium ethoxide was stored in a bubbler that was heated in a resistive heated aluminum oven (not shown). Argon (high purity) was used as a carrier gas to bring the metalorganic precursors into the reactor zone in proper proportions.

Oxygen (high purity) bubbled through deionized water was used as the reactant gas for reacting with the metalorganic precursors. The argon and oxygen flow rates were controlled by mass flow controllers (MFC). Pressure gages P were used at appropriate locations of the apparatus. The reactor pressure was set by the total flow rate. An IR (infrared radiation) lamp was used to heat a SiC coated susceptor SP on which the substrate is placed in the reaction zone to provide an appropriate substrate film growth temperature of about 800 degrees C. or greater. The deposition temperature was monitored by chromel-alumel thermocouple placed inside the susceptor.

The SBN thin films were grown on single crystal MgO and oxidized Si (100) substrates to provide an amorphous $SiO_2$ substrate film. The invention is not limited to these substrates and other amorphous or crystalline substrates can used such as including, but not limited to, $SrTiO_3$, $LaAlO_3$, $Al_2O_3$ and others.

General deposition conditions for the SBN thin films on the (100) MgO and amorphous oxidized (100) Si substrates are summarized herebelow in Table I. Thin film stoichiometry was determined by energy dispersive X-ray analysis.

TABLE I

| | |
|---|---|
| Growth Temperature (°C.) | ≧800 |
| Substrates | $SiO_2$/Si and MgO (100) |
| Growth Ratio (μm/hr) | 0.2–1.0 |
| Pressure (Torr) | 3.2–4.8 |
| Temperature of Barium Source (°C.) | 111–115 |
| Temperature of Strontium Source (°C.) | 108–113 |
| Temperature of Niobium Source (°C.) | 100–112 |

TABLE I-continued

| | |
|---|---|
| Total Flow Rate (sccm) | 115–140 |
| Oxygen Flow Rate (sccm) | 47–77 |
| Flow Rate Over Solid Sources (sccm) | 28–43 |
| Flow Rate Through Niobium Source (sccm) | 25–35 |
| Dilute Flow Rate for Niobium Source (sccm) | 5–10 |

An exemplary SBN thin film having the composition, $Sr_{0.45}Ba_{0.55}Nb_2O_6$, was made using the deposition conditions set forth herebelow in Table II.

TABLE II

| | |
|---|---|
| Growth Temperature | 800 degrees C. for 1 hour |
| Substrate | (100) MgO |
| Pressure | 3.63 torr |
| Temp. - BaHFA source | 115 degrees C. |
| Temp. - SrHFA source | 107 degrees C. |
| Temp. - Nb ethoxide source | 112 degrees C. |
| Total Flow Rate | 115 sccm |
| Flow Rate Over Solid Ba/Sr Source | 33 sccm |
| Flow Rate Through Nb Source | 30 sccm |
| Oxygen flow rate | 47 sccm |
| Deposition rate | 700 nm/hour |

An exemplary SBN thin film having the composition, $Sr_{0.70}Ba_{0.30}Nb_2O_6$, was made using the deposition conditions set forth herebelow in Table III.

TABLE III

| | |
|---|---|
| Growth Temperature | 800 degrees C. for 1 hour |
| Substrate | oxidized Si |
| Pressure | 3.33 torr |
| Temp. - BaHFA source | 113 degrees C. |
| Temp. - SrHFA source | 112 degrees C. |
| Temp. - Nb ethoxide source | 110 degrees C. |
| Total Flow Rate | 115 sccm |
| Flow Rate Over Solid Ba/Sr Source | 28 sccm |
| Flow Rate Through Nb Source | 35 sccm |
| Oxygen flow rate | 47 sccm |
| Deposition rate | 700 nm/hour |

The as-deposited SBN thin films where x=0.45 and 0.70 exhibited film thicknesses in the range of about 0.2 to about 1 micron.

Figure 2:
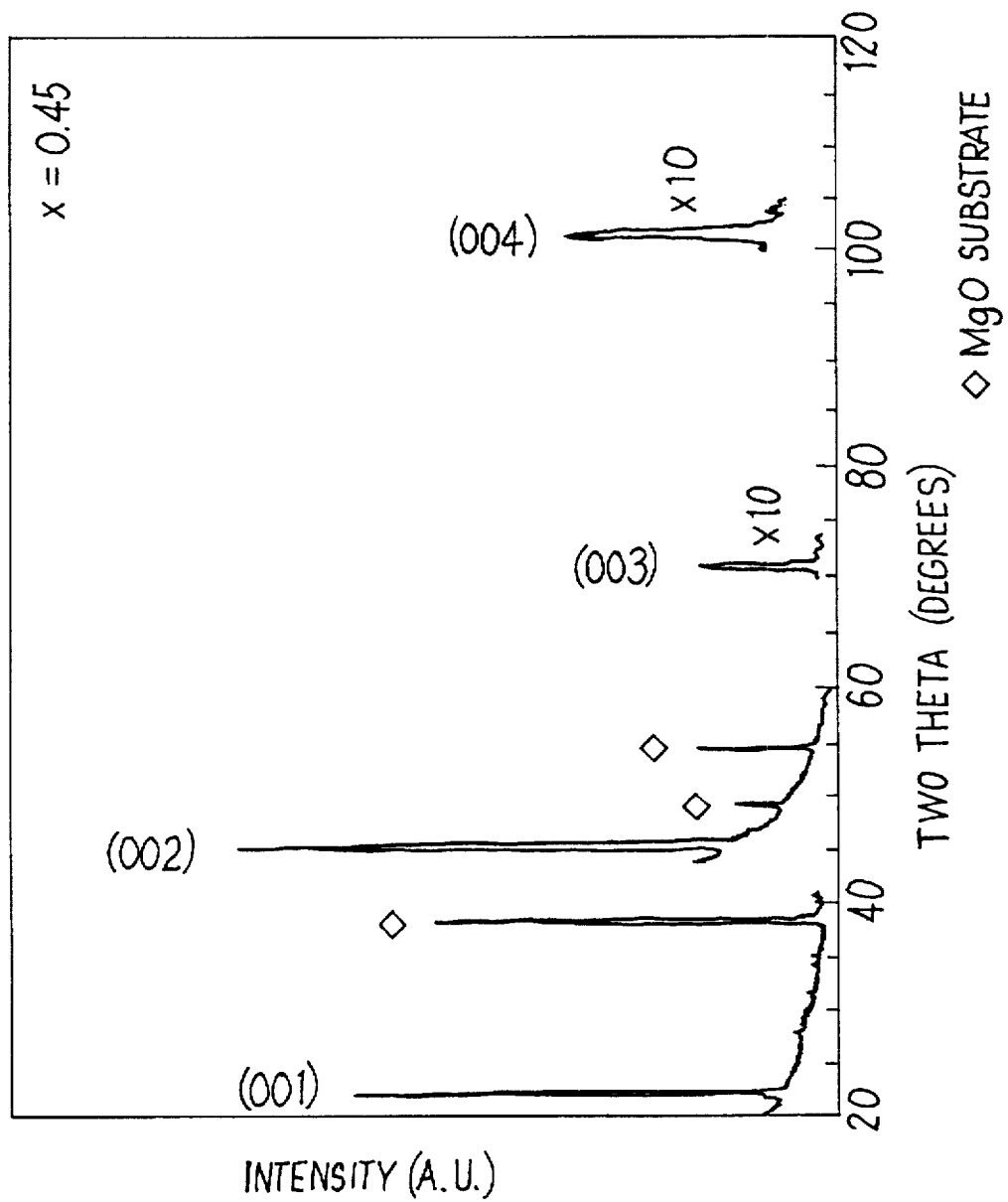
FIG. 2 is a graph illustrating an X-ray diffraction pattern of an SBN thin film (where x=0.45) deposited in accordance with the invention on a single crystal (100) MgO substrate showing preferred orientation.

The as-deposited SBN thin films where x=0.45 and 0.70 were subjected to X-ray diffraction analysis with a Rigaku X-ray powder diffractometer using Ni-filtered Cu K alpha radiation. On the single crystal (100) MgO substrates, the X-ray analysis indicated that the as-grown single phase SBN films were highly textured with a high degree of preferential orientation of the c-axis of the crystal lattice normal to the substrate surface plane as represented and evidenced by the presence of all peaks for the (001) group of planes where l=1,2,3,4 in the diffraction pattern of FIG. 2. That is, the exclusive presence of all four of the crystallographic planes (001), (002), (003), (004) indicates a c-axis oriented thin film.

Figure 3:
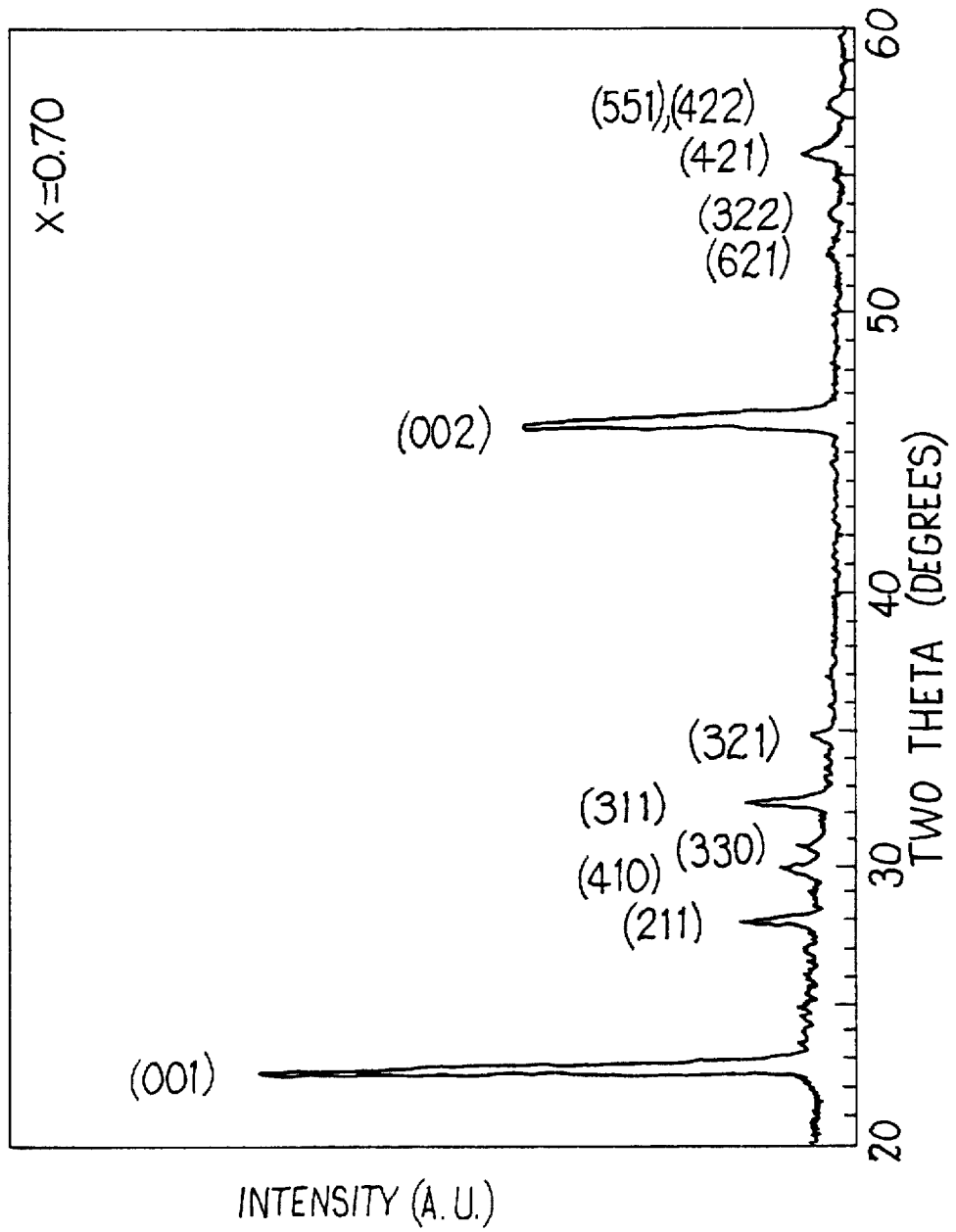
FIG. 3 is a graph illustrating an X-ray diffraction pattern of an SBN thin film (where x=0.70) deposited in accordance with the invention on amorphous $SiO_2$ formed by oxidizing a single crystal (100) Si substrate. The X-ray pattern indicates an (001) preferred orientation.

On the amorphous oxidized single crystal (100) Si substrates, the X-ray analysis indicated that the SBN film was oriented with a high degree of preferential orientation of the c-axis of the crystal lattice normal to the substrate surface plane as represented and evidenced by the presence of all peaks for the (001) planes where l=1,2 in the diffraction pattern of FIG. 3. The films deposited on amorphous $SiO_2$/Si substrates were determined to be highly c-axis [(001)] textured because of the relative intensities of the X-ray diffraction peaks for the (001) and (002) SBN planes.

For an isotropic (no preferred orientation) polycrystalline SBN film, the (001) and (002) reflections should have intensities of less than ⅓ and ¼ of the intensity of the (311) SBN reflection. FIG. 3 shows the (001) and (002) reflection to have much greater intensities that the (311) reflection.

Since the as-deposited SBN films exhibit a preferred orientation, the films should exhibit a second harmonic generation (SHG) response. SHG properties were measured using a Q-switched Nd:YAG laser at a wavelength of 1.064 micron using an apparatus described by Nystrom et al. at the Electronics Materials Conference, University of Colorado, Boulder, Colo. (1994) and by Lu et al. in Appl. Phys. Lett. 62, 22 (1993). The laser pulse width was 5 nanosecond with a repetition rate of 10 Hz. The second harmonic generation was measured in the transmission mode. Both the incident fundamental and the transmitted light beams were initially p polarized using two polarizers. The incident fundamental beam was inclined to the film normal by 45 degrees. Variations in laser output were corrected by normalization of the sample intensity ($I_s$) to the generated SH intensity from a quartz reference ($I_o$). To insure only SH intensities were measured, narrow band filters and monochromators were placed before the detectors. For these experiments, the sample was mounted to allow temperature control and corona poling simultaneous with the SHG measurements. The film and substrate were mounted on a glass slide coated with a thin conducting layer of indium-tin-oxide (ITO) on one side. The film was poled by positioning a tungsten needle approximately 3 millimeters above the film surface and applying voltages up to 10 kilovolts between the grounded ITO layer and the needle. A heater thermally connected to the film and substrate allowed control of the sample temperature. During poling, the sample was heated to elevated temperature to accelerate the poling process.

Figure 4:
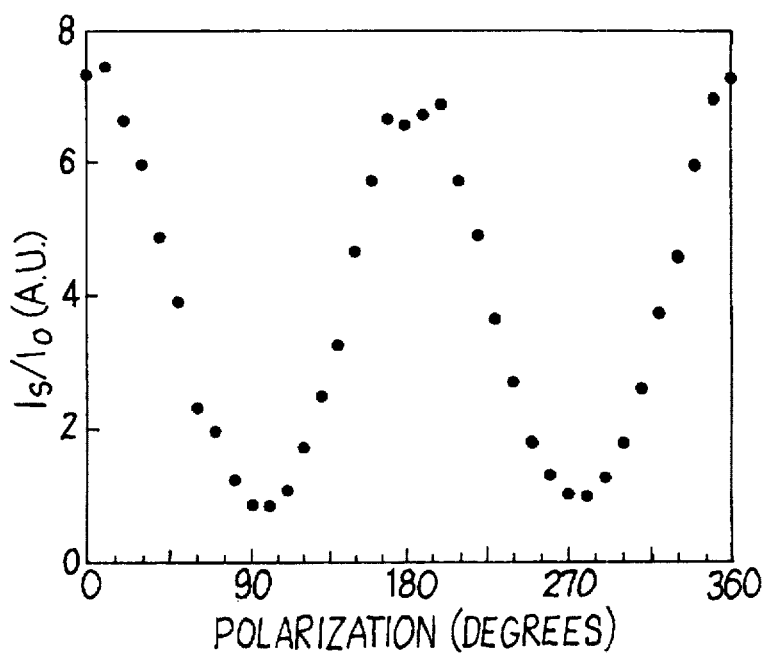
FIG. 4 is a graph of the second harmonic (SH) intensity from an as-deposited SBN thin film (where x=0.4) with incident polarization characteristic of a highly aligned tetragonal crystal structure.
Figure 5:
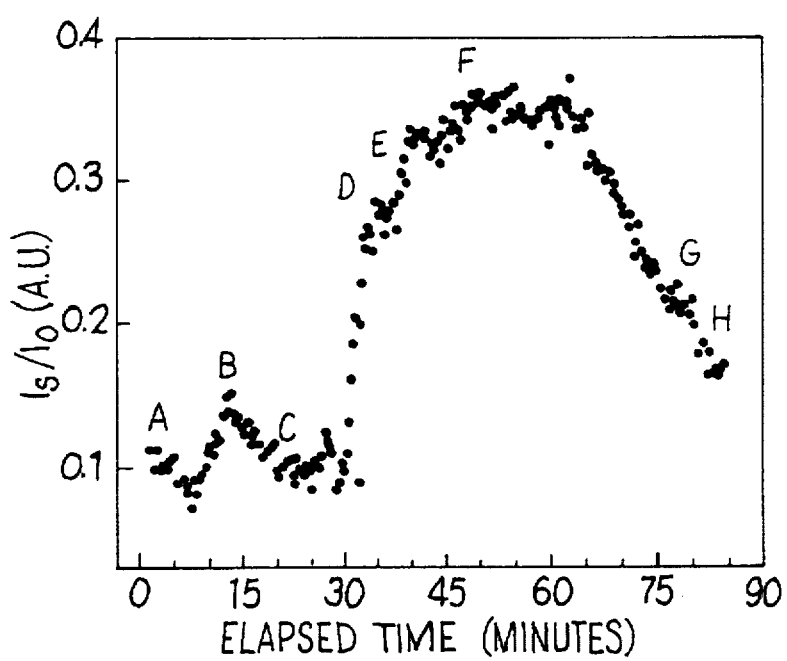
FIG. 5 is is a graph of SH intensity versus time of SBN thin film (where x=0.6) where A represents beginning of temperature ramping, B represents sample reaching the ferroelectric transition temperature of approximately 110 degrees C., C represents sample reaching poling temperature of approximately 150 degrees C., D represents applied voltage reaching 4 kV, E represents applied voltage reaching maximum (7 kV), F represents sample cooling to ferroelectric transition temperature and being held there for 15 minutes, and G represents sample reaching room temperature.

The $Sr_xBa_{1-x}Nb_2O_6$ thin film samples were first measured at room temperature for varying incident fundamental polarization. FIG. 4 shows a plot of SH intensity versus incident polarization for an as-deposited film with composition x=0.4. The results are characteristic of a highly aligned c-axis oriented, tetragonal crystal structure. As-deposited SBN films exhibiting lower SHG intensities (e.g. $I_s/I_o$ less than 1) were poled to align the domains and to enhance the effective nonlinear coefficient of the film. The monitored SH intensity for a typical poling process for SBN films is shown in FIG. 5 for a film composition x=0.6. The procedure began by heating the film to near or above the ferroelectric transition at 110 degrees C. without an applied electric field. After the temperature stabilized, the electric field was applied. The film was then slowly cooled under the applied electric field to room temperature at which time the poling field was removed. The maximum SH intensity was observed at the Curie temperature. As the sample was cooled below the Curie temperature, the SH intensity decreased. The SH intensity measured during poling was found to increase by as much as an order of magnitude from the as-deposited value. After the poling process, a threefold increase in SH intensity from the initial as-deposited value remained.

Achievement of the preferential c-axis alignment of the SBN thin films perpendicular to the amorphous and crystalline substrate surface is advantageous to effectively utilize the high dielectric and electro-optic properites along that lattice axis. For example, the dielectric constant of SBN where x=0.25 is $\epsilon_{33}$=3400 along the c-axis, as compared to a value of 500 along the a-axes. Similarly, the electro-optic coefficient or property ($r_{33}$=1400 picometer/volt) is much higher along the c-axis than along the other axes of the crystal lattice. The second order nonlinear optical susceptibility (coefficient), d, of the SBN thin films of the invention were as high as 8.7 times that of quartz (approximately 0.3 picometer/volt).

Figure 6:
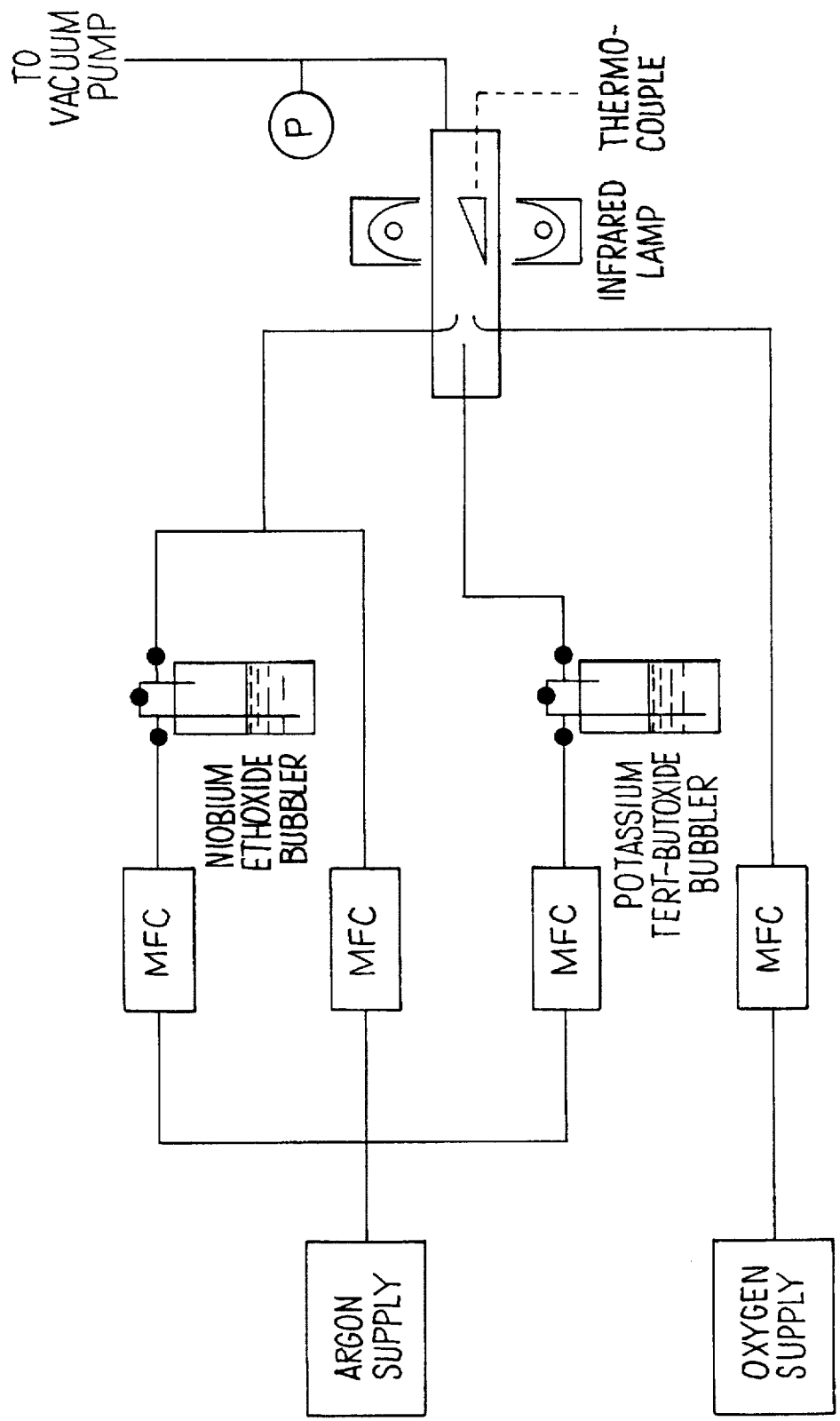
FIG. 6 is a schematic illustration of apparatus for metalorganic chemical vapor deposition of a preferentially oriented $KNnO_3$ ferroelectric thin film on a substrate.

As further illustration of the present invention, epitaxial, single phase potassium niobate ($KNbO_3$) thin films (hereafter "KN" thin films) were deposited by low pressure MOCVD using particular improved precursors on single crystal (100) spinel ($MgAl_2O_3$), (100) lanthanum aluminate ($LaAlO_3$), and (100) magnesium oxide (MgO) substrates. The room temperature lattice mismatch for the a-axis oriented (110) $KNbO_3$ deposited on the listed substrates is approximately 0, 5%, and −5% for the respective substrates. In the MOCVD process to form the KN thin films, particular improved volatile metalorganic oxide precursors were used including a niobium pentaethoxide $[Nb(OCH_2CH_3)_5]_2$ reactant and a rigorously purified potassium tert-butoxide ($[KOC(CH_3)_3]_4$) reactant (melting point=220 degrees C.), and oxygen as the oxidizing agent with ultra high purity argon as the carrier gas. FIG. 6. Use of the potassium tert-butoxide metalorganic oxide reactant was advantageous from the standpoint of temperature stability and controllability in producing single phase, preferentially oriented $KNbO_3$ thin films on the substrates. The deposition rate was controlled by niobium source concentration.

An excess of the aforementioned potassium-bearing metalorganic oxide reactant greater than the stoichiometric amount of the atomic formula was used to insure potassium incorporation and facilitate production of single phase, preferentially oriented thin films, the excess being controlled by control of the temperature of the potassium-bearing metalorganic oxide reactant. Excess potassium was observed to be volitive and rejected from the film surface so as to leave a stoichiometric film on the substrate. KN films with thickness in excess of 1.1 micron were deposited, although film thicknesses of about 100 to 1100 mm can be provided.

An exemplary epitaxial KN thin film was made on the aforementioned substrates using the deposition conditions set forth herebelow in Table IV.

TABLE IV

| Growth Temperature | 800 degrees C. |
| --- | --- |
| Pressure | 4.6 torr |
| Temp. - K tert-butoxide source | 120 degrees C. |
| Temp. - Nb ethoxide source | 85 degrees C. |
| Total Flow Rate | 150 sccm |
| Flow Rate through K Source | 30 sccm |
| Flow Rate through Nb Source | 30 sccm |
| Oxygen flow rate | 85 sccm |
| Deposition rate | 70–100 nm/hour |

Figure 7:
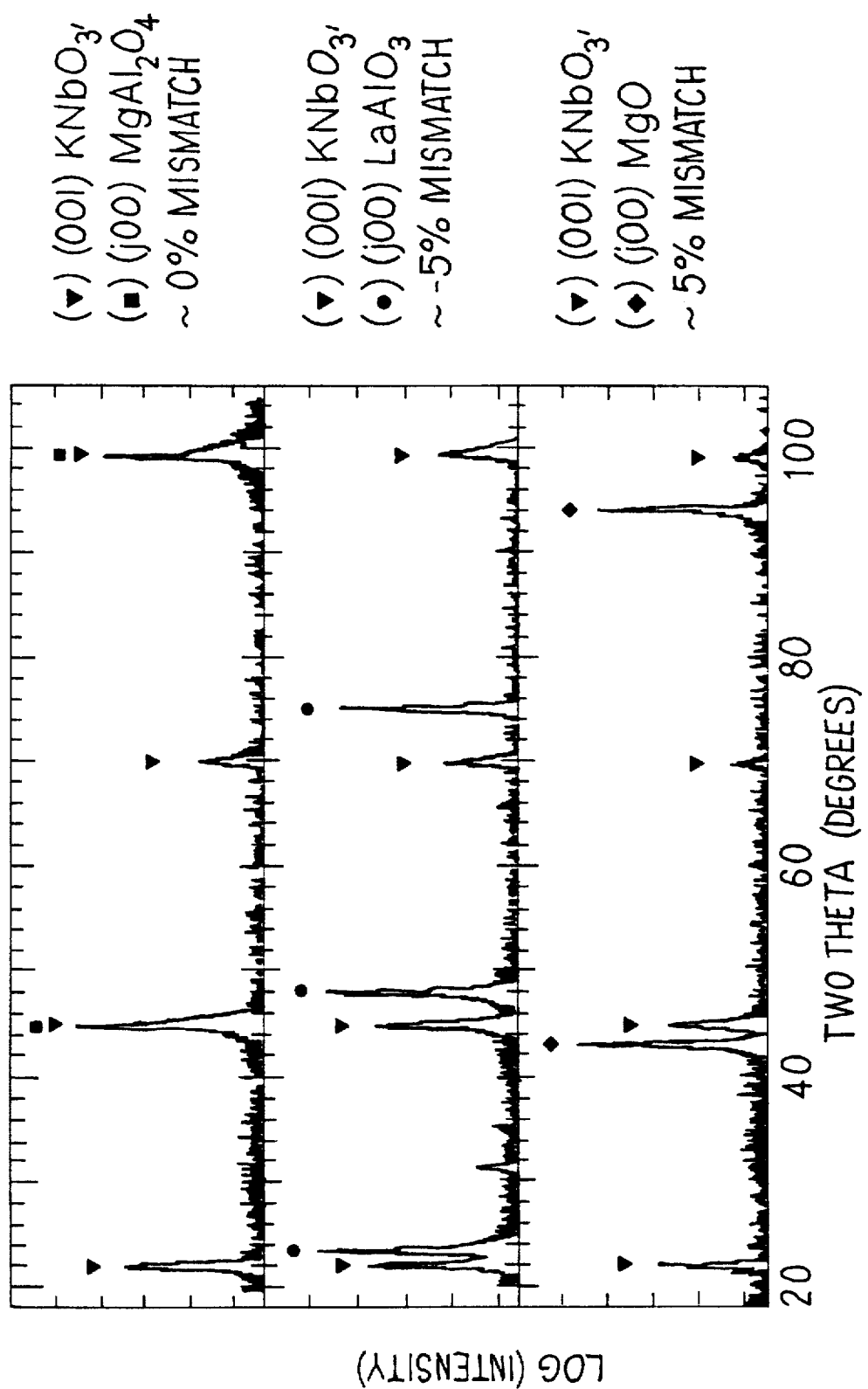
FIG. 7 is a graph illustrating an X-ray diffraction pattern of a $KNbO_3$ thin film deposited in accordance with the invention on different substrates including single crystal (100) $MgAl_2O_4$ (upperline), (100) $LaAlO_3$ (middle line), and (100) MgO (lower line).
Figure 8:
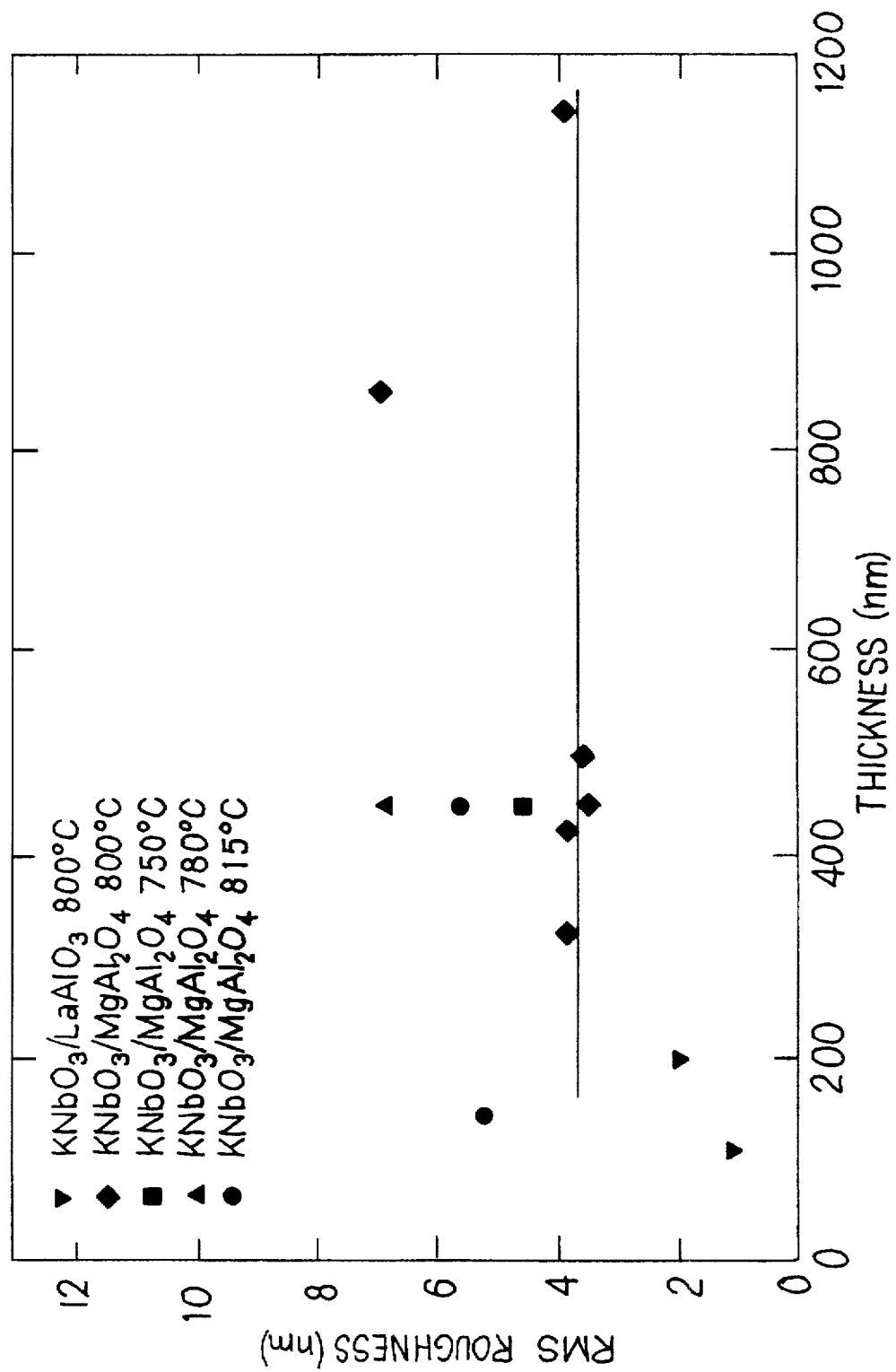
FIG. 8 is a graph of thin film surface roughness versus film thickness for $KNbO_3$ thin films on $LaAlO_3$ and $MgAl_2O_4$ substrates.

FIG. 7 is an X-ray diffraction pattern of the (110)-oriented KN thin films deposited in the manner described on the different substrates described hereabove and having a perovskite structure. X-ray phi scans indicated excellent registry between the thin film and the substrate, such as (110)[001]$KNbO_3$∥(100)[010]$LaAlO_3$. FIG. 8 is a graph of thin film surface roughness versus film thickness for $KNbO_3$ thin films grown at the listed temperatures on $LaAlO_3$ and $MgAl_2O_4$ substrates. The films exhibited under atomic force microscope examination a smooth, featureless surface morphology with a surface roughness, RMS (root mean square), as low as 2-4 nanometer; i.e not exceeding about 4 nm. The refractive index of the KN thin films was comparable to the refractive index of bulk $KNbO_3$.

The second order nonlinear susceptibility (coefficient) values, d, of the as-deposited KN thin films were as high as 13 picometers/volt relative to a quartz reference ($d_{\parallel quartz}$= 0.34 picometer/volt) and renders the films excellent candidates for constructing waveguide devices for second harmonic generation. In such a device, the infrared output of an inexpensive semiconductor laser is frequency doubled into the green, blue, or ultraviolet portion of the spectrum.

The present invention provides for the deposition of SBN, KN, and other thin films by metalorganic chemical vapor deposition using particular metalorganic precursors directly on a variety of amorphous and crystalline substrates that will allow the substantially higher dielectric, electro-optic, and non-linear optical properties of the films to be utilized in electronic, electro-optic, and frequency doubling microcomponents, such as dynamic random access memory devices, ferroelectric random access memory devices, optical waveguides, electro-optic modulators, frequency doubling devices and other components where the favorable dielectric, electro-optic properties, and non-linear optical properties of the thin film along an axis or direction can be utilized to advantage.

Although certain specific embodiments and features of the invention have been described hereabove, it is to be understood that modifications and changes may be made therein without departing from the spirit and scope of the invention as defined in the appended claims.

What is claimed is:

1. A method of forming a $KNbO_3$ thin film on a substrate surface, comprising depositing said film on the substrate surface in a reactor by metalorganic chemical vapor deposition using a potassium-bearing metalorganic reactant in excess of stoichiometric, a niobium-bearing metalorganic reactant, and oxygen reactant under temperature and pressure conditions that said film is single phase with a preferential crystal orientation relative to the substrate surface.

2. The method of claim 1 wherein the potassium-bearing metalorganic reactant comprises potassium tert-butoxide.

3. The method of claim 1 wherein the niobium-bearing metalorganic reactant comprises niobium ethoxide.

4. The method of claim 1 wherein the film has a (110) crystallographic orientation.

5. The method of claim 1 wherein excess potassium-bearing metalorganic reactant is determined by the temperature of said potassium-bearing metalorganic reactant.

6. A method of forming a $KNbO_3$ thin film on a substrate surface, comprising depositing said film on the substrate surface in a reactor by metalorganic chemical vapor deposition using a potassium-bearing metalorganic oxide reactant, niobium-bearing metalorganic oxide reactant, and oxygen reactant under temperature and pressure conditions that said film is single phase with a preferential crystal orientation relative to the substrate surface.

7. The method of claim 6 wherein the potassium-bearing metalorganic oxide reactant comprises potassium tert-butoxide.

8. The method of claim 6 wherein the niobium-bearing metalorganic oxide reactant comprises niobium ethoxide.

9. A method of forming a $Sr_xBa_{1-x}Nb_2O_6$ thin film, where x is greater than 0.25 and less than 0.75, on an amorphous substrate surface, comprising depositing said film on the amorphous substrate surface in a reactor by metalorganic chemical vapor deposition under conditions that said film includes a preferential crystal orientation relative to the amorphous substrate surface.

10. The method of claim 9 wherein a strontium (hexafluroacetylacetonate)$_2$ (tetraglyme) reactant, a barium (hexafluroacetylacetonate)$_2$ (tetraglyme) reactant, a niobium-bearing reactant, and oxygen reactant are provided in the reactor and reacted under temperature and pressure conditions to deposit said film on said substrate.

11. The method of claim 9 wherein said film is deposited to a thickness of about 0.2 to about 2 micron.

12. The method of claim 9 wherein said film is deposited under conditions to preferentially align an axis thereof substantially perpendicular to said substrate surface.

13. A method of forming a $KNbO_3$ thin film on a substrate surface, comprising depositing said film on the substrate surface in a reactor by metalorganic chemical vapor deposition using a potassium-bearing metalorganic reactant comprising potassium tert-butoxide in excess of stoichiometric, a niobium-bearing metalorganic reactant, and oxygen reactant under conditions that said film includes a preferential crystal orientation relative to the substrate surface.

14. A method of forming a $KNbO_3$ thin film on a substrate surface, comprising depositing said film on the substrate surface in a reactor by metalorganic chemical vapor deposition using a potassium-bearing metalorganic oxide reactant comprising potassium tert-butoxide, niobium-bearing metalorganic oxide reactant, and oxygen reactant under conditions that said film includes a preferential crystal orientation relative to the substrate surface.

* * * * *